United States Patent [19]

Kuriyama et al.

[11] Patent Number: 5,721,470
[45] Date of Patent: Feb. 24, 1998

[54] MICROWAVE GENERATOR APPARATUS COMPRISING CONTROLLER FOR AUTOMATICALLY ADJUSTING FILAMENT POWER OF A MAGNETRON

[75] Inventors: Noboru Kuriyama, Yokohama; Hiroaki Oichi, Kobe; Yoshiki Fukumoto, Kishiwada, all of Japan

[73] Assignees: Daihen Corporation; Shibaura Engineering Works Co., Ltd., both of Japan

[21] Appl. No.: 851,880

[22] Filed: May 6, 1997

Related U.S. Application Data

[63] Continuation of Ser. No. 445,281, May 19, 1995, abandoned.

[30] Foreign Application Priority Data

May 20, 1994 [JP] Japan .................................. 6-131341

[51] Int. Cl.⁶ ........................................................ H03B 9/10
[52] U.S. Cl. .................... 315/94; 339/86; 339/88; 339/91; 219/716; 219/761
[58] Field of Search ............................ 219/715, 716, 219/761, 702; 331/91, 86, 90, 105, 87, 88, 5; 315/106, 107, 94

[56] References Cited

U.S. PATENT DOCUMENTS

| | | | |
|---|---|---|---|
| 4,939,330 | 7/1990 | Berggren et al. | 219/716 |
| 4,939,331 | 7/1990 | Berggren et al. | 219/716 |
| 5,149,929 | 9/1992 | Minakawa et al. | 219/716 |
| 5,515,011 | 5/1996 | Pasco | 331/5 |

FOREIGN PATENT DOCUMENTS

| | | | |
|---|---|---|---|
| 3173093 | 7/1991 | Japan | 219/716 |
| 5-67493 | 3/1993 | Japan . | |

*Primary Examiner*—Robert Pascal
*Assistant Examiner*—Arnold Kinkead
*Attorney, Agent, or Firm*—Scully, Scott Murphy and Presser

[57] ABSTRACT

In a microwave generator apparatus including a magnetron having a filament and an anode and generating a microwave, a filament power source supplies a filament power to the filament of the magnetron, and an anode power source applies an anode voltage between the filament and the anode of the magnetron. Then a parasitic oscillation detecting circuit detects a parasitic oscillation voltage superimposed on the microwave generated by the magnetron, and a filament power controller, in response to the parasitic oscillation voltage detected by the parasitic oscillation detecting circuit, controls the filament power source to control the filament power so that the parasitic oscillation voltage is made smaller.

7 Claims, 2 Drawing Sheets

MICROWAVE GENERATOR APPARATUS COMPRISING CONTROLLER FOR AUTOMATICALLY ADJUSTING FILAMENT POWER OF A MAGNETRON

This application is a continuation of application Ser. No. 08/445,281, filed May 19, 1995, now abandoned.

BACKGROUND OF THE INVENTION

1. Field of the Invention

The present invention relates to a microwave generator apparatus, and in particular, to a microwave generator apparatus comprising a controller for automatically adjusting a filament power of a magnetron. In the specification, the filament power of the magnetron is defined as a product of a filament voltage and a filament current.

2. Description of the Related Art

In several plasma processing apparatuses such as a CVD processing apparatus which is one of the apparatuses for forming thin films, and etching apparatuses for manufacturing semiconductor apparatuses, plasma generated by a generated microwave is utilized. Such an apparatus is provided with a microwave generator apparatus comprising a magnetron for generating a microwave, a filament power source for supplying a filament of the magnetron with electric power, and an anode power source for supplying an anode voltage between the filament and an anode of the magnetron.

The filament of the magnetron is supplied with a rated filament power described in the product specifications from the filament power source. When a certain lot of magnetrons are made to generate a microwave, parasitic oscillation voltage is superimposed on the microwave output waveforms in all of the magnetrons. The parasitic oscillation generated causes the output waveform of the original rated output frequency to be modulated by the frequency of the parasitic oscillation. This parasitic oscillation voltage is further superimposed on the anode current and the anode voltage.

Since microwave generator apparatuses used for plasma processes are required to involve high precision power control, the superimposition of parasitic oscillation voltage on the microwave output waveform causes not only deteriorations in the precision of power detection but also deteriorations in impedance matching characteristics of microwave impedance matching devices. These deteriorations may affect fine processes.

As a result of various investigations, it has been found that the parasitic oscillation can be suppressed by applying into the filament of the magnetron, a filament power smaller than the rated filament power of the product specifications. By taking advantage of this, products are shipped after the parasitic oscillation has been suppressed by adjusting the output power of the filament power source while observing the parasitic oscillation of the microwave output waveform on a display of an oscilloscope.

However, the filament power by which the parasitic oscillation voltage is reduced differs from one another even if the magnetrons are of the same kind. This involves labors of adjusting and fixing the filament power for each one magnetron, which in turn causes the man-hours for testing products to greatly increase.

Further, since the magnetron is a consumable, it has been a practice to replace a life-expired magnetron with another one by selecting one suitable for the filament power at shipment or to return back the microwave generator apparatus, then the magnetron is replaced with another one and the filament power is re-adjusted. As a result, there has been no compatibility among magnetrons.

Furthermore, there is another problem that, when the filament power is lowered too much in the readjustment thereof for suppressing the parasitic oscillation, the quantity of thermoelectrons emitted from the filament becomes insufficient such that the microwave output is suspended.

Further, when the filament is set to a rather low level, deterioration of the filament due to long-time continuity may cause the thermoelectrons emitted from the filament to decrease in quantity, resulting in unstable microwave output. Furthermore, since the generation of parasitic oscillation changes depending on how the microwave is reflected from a load to the magnetron, the measure of fixing the filament power could not completely suppress the generation of parasitic oscillation.

SUMMARY OF THE INVENTION

An essential object of the present invention is therefore to provide a microwave generator apparatus capable of stably generating a microwave without any parasitic oscillation.

Another object of the present invention is to provide a microwave generator apparatus capable of suppressing any parasitic oscillation to be superimposed on the microwave output waveform.

In order to achieve the above-mentioned objective, according to one aspect of the present invention, there is provided a microwave generator apparatus comprising:

a magnetron for generating a microwave, said magnetron having a filament and an anode;

a filament power source for supplying a filament power to the filament of said magnetron;

an anode power source for applying an anode voltage between the filament and the anode of said magnetron;

a parasitic oscillation detecting means for detecting a parasitic oscillation voltage superimposed on the microwave generated by said magnetron; and a filament power controlling means for, in response to the parasitic oscillation voltage detected by said parasitic oscillation detecting means, controlling said filament power source to control the filament power so that the parasitic oscillation voltage is made smaller.

In the above-mentioned microwave generator apparatus, said parasitic oscillation detecting means detects the parasitic oscillation voltage by detecting a parasitic oscillation signal component superimposed on an anode voltage between the filament and the anode of said magnetron.

In the above-mentioned microwave generator apparatus, said filament power controlling means comprises:

noise level setting means for manually setting a noise level;

first adder means for adding the parasitic oscillation voltage detected by said parasitic oscillation detecting means to the noise level set by said noise level setting means, and outputting a signal representing an added result;

first integrator means for integrating the signal outputted from said first adder means, and outputting a signal representing an integrated result;

first diode means for blocking a positive voltage of the signal outputted from said first integrator means, and outputting a signal representing a blocked result;

rated filament power setting means for manually setting a rated filament power set value; and second adder means for adding the signal outputted from said first diode means, to the rated filament power set value set by said rated filament power setting means, and outputting a signal representing an added result to said filament power source, as a signal for controlling the filament power.

The above-mentioned microwave generator apparatus, further comprises:

anode voltage detecting means for detecting an anode voltage which is applied between the filament and the anode of said magnetron, wherein said filament power controlling means for, in response to the parasitic oscillation voltage detected by said parasitic oscillation detecting means and the anode voltage detected by said anode voltage detecting means, controlling said filament power source to control the filament power so that the parasitic oscillation voltage is made smaller.

In the above-mentioned microwave generator apparatus, said parasitic oscillation detecting means detects the parasitic oscillation voltage by detecting a parasitic oscillation signal component superimposed on an anode voltage between the filament and the anode of said magnetron.

In the above-mentioned microwave generator apparatus, said filament power controlling means comprises:

noise level setting means for manually setting a noise level;

first adder means for adding the parasitic oscillation voltage detected by said parasitic oscillation detecting means from the noise level set by said noise level setting means, and outputting a signal representing an added result;

first integrator means for integrating the signal outputted from said first adder means, and outputting a signal representing an integrated result;

first diode means for blocking a positive voltage of the signal outputted from said first integrator means, and outputting a signal representing a blocked result;

rated filament power setting means for manually setting a rated filament power set value; and second adder means for adding the signal outputted from said first diode means, to the rated filament power set value set by said rated filament power setting means, and outputting a signal representing an added result to said filament power source, as a signal for controlling the filament power.

The above-mentioned microwave generator apparatus further comprises microwave output judgment means, wherein said microwave output judgment means comprises:

microwave output judgment setting means for manually setting a microwave output judgment level value;

third adder means for adding the microwave output judgment value set by said microwave output judgment setting means, to the anode voltage detected by said anode voltage detecting means, and outputting a signal representing an added value;

second integrator means for integrating the signal outputted from said third adder means, and outputting a signal representing an integrated result; and second diode means for blocking a negative voltage of the signal outputted from said second integrator means, and outputting a signal representing a block result to said second adder means, wherein said second adder means adds the signal outputted from said first diode means, to a sum of the rated filament power set value set by said rated filament power setting means, and a signal outputted from said second diode means, and outputting a signal representing an added result to said filament power source, as a signal for controlling the filament power.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Preferred embodiments according to the present invention will be described below with reference to the attached drawings.

First Preferred Embodiment

Figure 1:
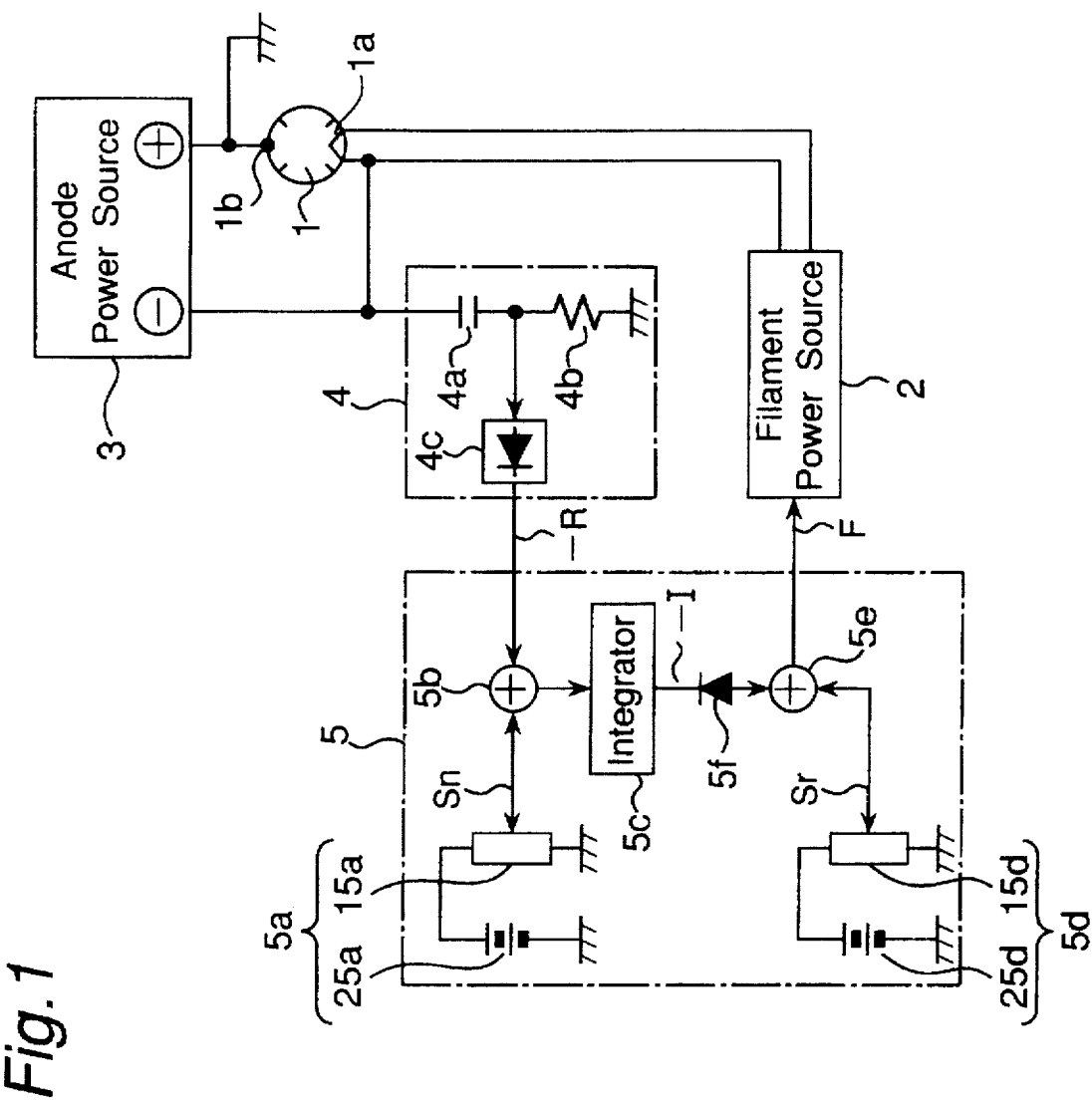
FIG. 1 is a block diagram of a microwave generator apparatus according to a first preferred embodiment of the present invention.

FIG. 1 is a block circuit diagram of a microwave generator apparatus according to a first preferred embodiment of the present invention.

Referring to FIG. 1, a filament 1a of a magnetron 1 is supplied with an appropriate filament power outputted from a filament power source 2 of output power control type, in response to a filament power set value inputted to the filament power source 2. Further, a positive electrode of an anode power source 3 is grounded and is electrically connected to an anode 1b, and a negative electrode of the anode power source 3 is electrically connected to one end of the filament 1a. In order to change the output power of the microwave generated by the magnetron 1, a high DC (Direct Current) voltage is supplied so as to allow the control of anode current.

A parasitic oscillation detection circuit 4 converts a parasitic oscillation voltage component superimposed on the anode voltage into a DC parasitic oscillation voltage R which is proportional to the magnitude of the parasitic oscillation voltage, as a control quantity for implementing feedback control, for example, by detecting a voltage across a resistor 4b connected in series with a capacitor 4a and rectifying the detected voltage by a rectifier 4c, as shown in FIG. 1. The parasitic oscillation voltage value R differs variously even with the same kind of magnetron and further differs with the same filament power.

In a filament power control circuit 5, a noise level set value Sn is manually set by a noise level setter 5a for setting a noise level in direct current where the noise setter 5a comprises a DC voltage source 25a and a DC voltage adjuster 15a, and then, the noise level set value Sn of a positive DC voltage is applied to an adder 5b. On the other hand, the parasitic oscillation voltage value R detected by the parasitic oscillation detection circuit 4 is applied as a negative DC voltage to the adder 5b. Then, the filament power control circuit 5 outputs to an integrator 5c having a predetermined amplification degree K and a predetermined time constant, a true parasitic oscillation voltage component {Sn+(−R)} obtained by removing the noise level component Sn from the parasitic oscillation voltage component R.

The resulting output signal from the adder 5b is integrated by the integrator 5c having a predetermined amplification degree K. Then, an output signal I from the integrator 5c is applied as a negative DC voltage to an adder 5e through a cathode and an anode of a diode 5f for blocking the positive voltage of the output signal from the integrator 5c. On the other hand, a signal of a rated filament power set value Sr which is manually set by a rated filament power setter 5d comprising a DC voltage source 25d and a DC voltage adjuster 15d is applied as a positive DC voltage to the adder 5e. In this case, an output signal {Sr+(−I)} resulting by adding the integrator output signal −I to the power set value Sr is inputted to the filament power source 2 as an output power set value F of the filament power source 2.

It is noted that the diode 5f is provided for blocking the positive voltage signal of the noise level set value Sn so that the noise set value Sn is not added to the rated filament power set value Sr for a magnetron 1 in which there is caused no parasitic oscillation at the rated filament power set value Sr and the magnetron 1 can stably generate a microwave.

The resistance of the resistor 4b of the parasitic oscillation detection circuit 4 is selected so that the parasitic oscillation voltage R has the following relationship to the noise level set value Sn: |R|>|Sn|. Further, the amplification degree K of the integrator 5c of the filament power control circuit T is selected so that the integrator output signal I has the following relationship to the set value Sr of the rated filament power setter 5d: |Sr|>|I|.

In the above-mentioned circuit arrangement, on condition that a parasitic oscillation is generated at the time of start-up with a certain set value Sr, an integral value K{Sn+(−R)} which is the output signal I from the integrator 5c is fed back to the filament power source 2, so that the output power set value F of the filament power source 2 gradually lowers or decreases from the rated filament power set value Sr set by the rated filament power setter 5d by the feedback control until the absolute value of the parasitic oscillation voltage |R| becomes equal to the absolute value of the noise level set value |Sn|, that is, until the true parasitic oscillation voltage component resulting from removing the noise component from the parasitic oscillation voltage component becomes zero. As a result, the output power set value F of the filament power source 2 lowers or decreases to an output power set value F=Fb at which the feedback control is maintained in a stable state.

When the parasitic oscillation voltage |R| finally becomes equal to the noise level set value |Sn|, the input signal of the integrator 5c becomes zero, and then, the integrator begins to discharge the electrical charge. Then, as the negative DC output signal I from the integrator 5c increases, the output power set value F of the filament power source 2 which is the output of the adder 5e increases. On the other hand, the output power set value F thereof is subject to feedback control by the integrator 5c that serves as a delay element after the output power set value F has begun increasing gradually. Therefore, the output power set value F thereof decreases once again to the above-mentioned output power set value Fb from an output power set value which is determined by (a) a resistance of the resistor 4b and (b) an amplification degree K and a time constant of the integrator 5c. This process is repeated from now so that a filament power corresponding to substantially the constant output power set value Fb is supplied from the filament power source 2 to the filament 1a of the magnetron 1.

The value of the output power set value Fb differs variously even in the case of the same kind of magnetrons, however, the voltage level of the parasitic oscillation becomes zero against any of the various set values Fb as described above. For example, there are such cases that all the numbers of magnetrons of a certain lot exhibit stable microwave output, that the magnetrons thereof exhibit both stable and unstable microwave output, and that all the numbers of magnetrons thereof exhibit unstable microwave output. Therefore, the lower the above-mentioned output power set value Fb is set, the more unstable the microwave output thereof becomes.

In the above-described first preferred embodiment, previously determined by an experiment performed by the present inventor is the filament power at which the microwave output thereof begins to go unstable because of a shortage of the quantity of emitted thermoelectrons due to the lowering of the filament power in the case of a large number of magnetrons of the same kind. In this case, the output power set value F is set to F=Fm, and then, the resistance of the resistor 4b and the amplification degree K and time constant of the integrator 5c are selected in addition to the above-mentioned selection conditions, |R|>|Sn| and |Sr|>|I|, so that the above-defined output power set value Fm satisfies the following requirement: (Sr−I)≧Fm>Fb.

Accordingly, the voltage level of the parasitic oscillation can be reduced simply by lowering the filament power from the rated filament power set value Sr of the rated filament power setter 5d, and also all of the magnetrons can be operated normally. Moreover, if the output power set value Fm is set to a value slightly larger than the above-mentioned rated filament power set value Sr, all the numbers of magnetrons can be operated normally.

Second Preferred Embodiment

Figure 2:
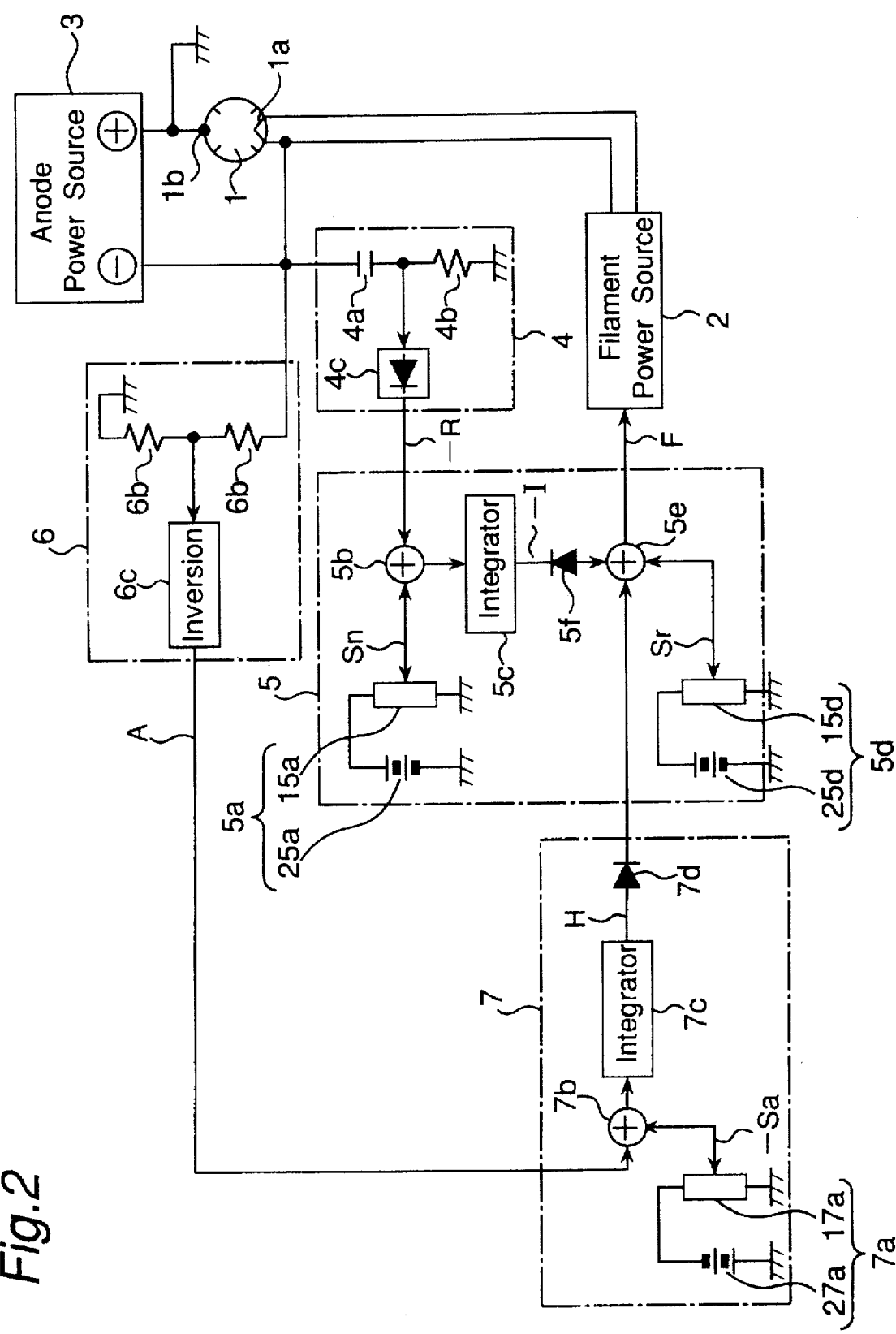
FIG. 2 is a block diagram of a microwave generator apparatus according to a second preferred embodiment of the present invention.

FIG. 2 is a block circuit diagram of a microwave generator apparatus according to a second preferred embodiment of the present invention, and in FIG. 2, the same components as those shown in FIG. 1 are denoted by the same numeral references as those shown in FIG. 1.

As is apparent from comparison between FIGS. 1 and 2, in the second preferred embodiment, an anode voltage detection circuit 6 and a microwave output judgment circuit 7 are further provided in addition to the first preferred embodiment shown in FIG. 1.

Referring to FIG. 2, the anode voltage detection circuit 6 detects a voltage induced across a resistor 6a where two resistors 6a and 6b are connected in series, and outputs to an adder 7b, a positive anode proportional voltage A, which is proportional to the magnitude of an anode voltage, through an inversion circuit 6c.

In the microwave output judgment circuit 7, a judgment level set value Sa outputted from a microwave output judgment setter 7a, which comprises a DC voltage source 27a and a DC voltage adjuster 17a and then provides a manually set value by an anode voltage that allows the degree of instability of microwave output to be judged, is inputted to the adder 7b. On the other hand, an anode proportional voltage A outputted from the anode voltage detection circuit 6 is inputted to the adder 7b. Then the adder 7b adds the judgment level set value −Sa to the anode proportional voltage A, and outputs the resulting value {A+(−Sa)} to an integrator 7c having a predetermined amplification degree and a time constant. The output signal of {A+(−Sa)} resulting by adding the judgment level set value −Sa to the anode proportional voltage A is integrated by the integrator 7c, and the resulting output signal H from the integrator 7c is inputted through an anode and a cathode of a diode 7d for blocking the negative voltage of the output signal from the integrator 7c, to an adder 5e of the filament power control circuit 5.

In this case, the output signal H from the integrator 5c is inputted to the adder 5e together with the output signal I from the integrator 5c of the filament power control circuit 5 and the rated filament power set value Sr of the rated filament power setter 5d. Then the output signal {Sr+(−I)+H} from the adder 5e is inputted as an output power set value F to the filament power source 2. It is noted that, when the microwave output from the magnetron 1 is stable, a diode 7d makes a block so that the output signal {A+(−Sa)} of the adder 7b will not be added to the rated filament power set value Sr and that the judgment level set value Sa will not be added to the rated filament power set value Sr at the time of start-up.

The resistance of the resistor 6a of the anode voltage detection circuit 6 is so selected that the anode proportional voltage A satisfies the following requirement: |A|>|Sa|, when the microwave output from the magnetron 1 is unstable with respect to the judgment level set value Sa. The output signal {A+(−Sa)} from the adder 7b is so selected as to make the output signal of the adder 5e of the filament power control circuit 5 slightly larger.

The judgment level set value Sa of the microwave output judgment setter 7a is previously determined by an experiment performed by the present inventor by taking advantage of the fact that the anode voltage rises as the microwave output becomes unstable. The judgment level set value Sa is set so as to be larger than the anode voltage that is obtained when the microwave output is stable.

With the arrangement as described above, on condition that the feedback control is stable, for example, at a certain output power set value F=Fb, and that the microwave output of the magnetron 1 is still stable, when the parasitic oscillation voltage |R| finally (in other words, in a balanced state of the feed back loop) becomes equal to the noise level set value |Sn| in a manner similar to that of the first preferred embodiment, the input signal to the integrator 5c becomes zero, and then the integrator 5c begins to discharge the electrical charge. Then as this negative output signal I increases, the output power set value F, which is the output signal from the adder 5e, also increases. However, since the output power set value F, having begun to decrease gradually, is subjected to feedback control by the integrator 5c, the output power set value F decreases or lowers again to the output power set value Fb. This process is repeated from now. In addition, in this case, the anode proportional voltage A and the judgment level set value Sa are set such that |A|<|Sa| and then, the output signal {A+(−Sa)} from the adder 7b is negative. Therefore, the anode proportional voltage A and the judgment level set value Sa are blocked by the diode 7d, so as not to be inputted to the adder 5e of the filament power control circuit 5.

On the other hand, the parasitic oscillation voltage becomes substantially zero at a certain output power set value Fb. However, if the microwave output of the magnetron 1 is unstable, or if the microwave output thereof becomes unstable during an operation of lowering to the output power set value Fb, the anode voltage rises such that |A|>|Sa|. Then the output signal {A+(−Sa)} from the adder 7b is integrated by the integrator 7c and then the resulting output signal H from the integrator 7c is inputted to the adder 5e. As a result, the output power set value F of the filament power source 2 is increased, and then, the output power set value F gradually is increased by the feedback control until the absolute value of the anode proportional voltage |A| becomes equal to the absolute value of the judgment level set value |Sa|. In this case, the set value F is increased so as to reach a output power set value Fc at which the stable state of the feedback control is maintained.

Finally, when the absolute value of the anode proportional voltage |A| becomes equal to the absolute value of the judgment level set value |Sa|, the input signal of the integrator 7c becomes zero, and then, the integrator begins to discharge the electrical charge. As the output signal H from the integrator 7c decreases, the output power set value F, which is the output of the adder 5e also decreases. However, since the output power set value F, having begun to decrease gradually, is subject to feedback control by the integrator 5c, the output power set value F rises from the output power set value which is determined by the resistance of the resistor 6a and the time constant of the integrator 7c again to the output power set value Fb. This process is repeated thereafter so that the filament power corresponding to substantially a constant output power set value Fc is supplied from the filament power source 2 to the filament 1a of the magnetron 1.

In the above-mentioned second preferred embodiment, the parasitic oscillation voltage value can be made zero or substantially zero by judging the magnitude of the anode voltage without selecting the resistance of the resistor 4b and amplification degree K and time constant of the integrator 5c so as to satisfy the following requirement: (Sr−I)≧Fm>Fb, in a manner similar to that of the first preferred embodiment. Then, all the number of magnetrons can be operated normally.

In each case of the above preferred embodiments, parasitic oscillation voltage may also be detected from a detected signal of the microwave generated by the magnetron 1 or the anode current following the anode of magnetron 1.

As described above, according to the preferred embodiments of the present invention, the magnetron 1 can be properly operated by detecting the parasitic oscillation voltage generated when a microwave is generated from the magnetron 1 and by automatically adjusting the filament power. Further, the parasitic oscillation voltage superimposed on the output waveforms of the microwave can be automatically suppressed. Therefore, the need of adjusting the filament power for individual magnetrons is eliminated. This makes it feasible to reduce manhours for adjustment and test processes, as well as to ensure magnetrons compatibility due to the elimination of the need of selecting magnetrons, and moreover makes it easy to obtain an impedance matching of the magnetrons 1.

In particular, according to the first preferred embodiment of the present invention, the parasitic oscillation voltage can be reduced, and further, almost all of the magnetrons can be operated normally.

Further, according to the second preferred embodiment of the present invention, the parasitic oscillation voltage can be made zero or substantially zero, and further, all the number of magnetrons can be operated normally.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A microwave generator apparatus for automatically adjusting filament power in a magnetron to suppress parasitic oscillation voltages generated by the magnetron, comprising:

a magnetron for generating a microwave, said magnetron having a filament and an anode;

a filament power source for supplying a filament power to the filament of said magnetron, including means for supplying an adjustable voltage across the filament and the anode;

an anode power source, separate from the filament power source, for applying an anode voltage between the filament and the anode of said magnetron, and wherein the magnetron generates a microwave output at a rated output frequency and the microwave output at the rated output frequency is modulated by a parasitic oscillation voltage at a parasitic oscillation frequency;

a parasitic oscillation detecting means for detecting a parasitic oscillation voltage which modulates and is superimposed on the microwave output generated by said magnetron; and a filament power controlling means for, in response to the parasitic oscillation voltage detected by said parasitic oscillation detecting means, controlling said filament power source to control the filament power so that the parasitic oscillation voltage is suppressed and made smaller.

2. The microwave generator apparatus as claimed in claim 1, wherein said parasitic oscillation detecting means detects the parasitic oscillation voltage by detecting a parasitic oscillation signal component superimposed on an anode voltage between the filament and the anode of said magnetron.

3. The microwave generator apparatus as claimed in claim 1, wherein said filament power controlling means comprises:

noise level setting means for manually setting a noise level;

first adder means for adding the parasitic oscillation voltage detected by said parasitic oscillation detecting means to the noise level set by said noise level setting means, and outputting a signal representing an added result;

first integrator means for integrating the signal outputted from said first adder means, and outputting a signal representing an integrated result;

first diode means for blocking a positive voltage of the signal outputted from said first integrator means, and outputting a signal representing a blocked result;

rated filament power setting means for manually setting a rated filament power set value; and second adder means for adding the signal outputted from said first diode means, to the rated filament power set value set by said rated filament power setting means, and outputting a signal representing an added result to said filament power source, as a signal for controlling the filament power.

4. The microwave generator apparatus as claimed in claim 1, further comprising:

anode voltage detecting means for detecting an anode voltage which is applied between the filament and the anode of said magnetron, wherein said filament power controlling means for, in response to the parasitic oscillation voltage detected by said parasitic oscillation detecting means and the anode voltage detected by said anode voltage detecting means, controlling said filament power source to control the filament power so that the parasitic oscillation voltage is made smaller.

5. The microwave generator apparatus as claimed in claim 4, wherein said parasitic oscillation detecting means detects the parasitic oscillation voltage by detecting a parasitic oscillation signal component superimposed on an anode voltage between the filament and the anode of said magnetron.

6. The microwave generator apparatus as claimed in claim 4, wherein said filament power controlling means comprises:

noise level setting means for manually setting a noise level;

first adder means for adding the parasitic oscillation voltage detected by said parasitic oscillation detecting means from the noise level set by said noise level setting means, and outputting a-signal representing an added result;

first integrator means for integrating the signal outputted from said first adder means, and outputting a signal representing an integrated result;

first diode means for blocking a positive voltage of the signal outputted from said first integrator means, and outputting a signal representing a blocked result;

rated filament power setting means for manually setting a rated filament power set value; and second adder means for adding the signal outputted from said first diode means, to the rated filament power set value set by said rated filament power setting means, and outputting a signal representing an added result to said filament power source, as a signal for controlling the filament power.

7. The microwave generator apparatus as claimed in claim 6, further comprising microwave output judgment means, wherein said microwave output judgment means comprises:

microwave output judgment setting means for manually setting a microwave output judgment level value;

third adder means for adding the microwave output judgment value set by said microwave output judgment setting means, to the anode voltage detected by said anode voltage detecting means, and outputting a signal representing an added value;

second integrator means for integrating the signal outputted from said third adder means, and outputting a signal representing an integrated result; and second diode means for blocking a negative voltage of the signal outputted from said second integrator means, and outputting a signal representing a block result to said second adder means, wherein said second adder means adds the signal outputted from said first diode means, to a sum of the rated filament power set value set by said rated filament power setting means, and a signal outputted from said second diode means, and outputting a signal representing an added result to said filament power source, as a signal for controlling the filament power.

* * * * *

UNITED STATES PATENT AND TRADEMARK OFFICE
CERTIFICATE OF CORRECTION

PATENT NO. : 5,721,470
DATED : February 24, 1998
INVENTOR(S) : N. Kuriyama, et al.

It is certified that error appears in the above-indentified patent and that said Letters Patent is hereby corrected as shown below:

On the Title Page, Section [73]: "Daihen Corporation; Shibaura Engineering Works., Ltd." should read --Shibaura Engineering Works Co., Ltd.; Daihen Corporation--

Column 9, lines 3 and 4, Claim 1: delete "and the anode"

Column 10, line 21, Claim 6: "a-signal" should read --a signal--

Signed and Sealed this

Twenty-third Day of March, 1999

*Attest:*

Q. TODD DICKINSON

*Attesting Officer*  *Acting Commissioner of Patents and Trademarks*